United States Patent

Mori et al.

[11] Patent Number: 5,124,311
[45] Date of Patent: Jun. 23, 1992

[54] STRUCTURE OF CERAMIC SUPERCONDUCTIVE WIRING AND PROCESS OF FABRICATION THEREOF

[75] Inventors: Satoru Mori; Hideaki Yoshida; Takuo Takeshita; Yoshio Kanda, all of Saitama, Japan

[73] Assignee: Mitsubishi Kinzoku K.K., Tokyo, Japan

[21] Appl. No.: 362,466

[22] PCT Filed: Sep. 28, 1988

[86] PCT No.: PCT/JP88/00985
§ 371 Date: May 30, 1989
§ 102(e) Date: May 30, 1989

[87] PCT Pub. No.: WO89/03126
PCT Pub. Date: Apr. 6, 1989

[30] Foreign Application Priority Data
Sep. 29, 1987 [JP] Japan ................... 62-246956
Dec. 25, 1987 [JP] Japan ................... 62-332979

[51] Int. Cl.⁵ ............................................... B32B 9/00
[52] U.S. Cl. ............................ 505/1; 505/701; 505/702; 505/703; 505/704; 428/209; 428/432; 428/457; 428/461; 428/688; 428/701; 428/901; 428/930; 427/62; 156/89
[58] Field of Search ................ 156/89; 427/62; 428/209, 210, 426, 432, 457, 461, 688, 701, 901, 930; 505/1, 701-704

[56] References Cited
FOREIGN PATENT DOCUMENTS
45194 10/1983 Japan .

Primary Examiner—Patrick J. Ryan
Attorney, Agent, or Firm—Sughrue, Mion, Zinn, Macpeak & Seas

[57] ABSTRACT

There is disclosed the structure of a superconductive wiring fabricated on an insulating substrate comprising a conductive pattern having at least one wiring strip of a superconductive ceramic formed on the insulating substrate and a protective film covering the wiring pattern and formed of a basic oxide, the basic oxide hardly reacts with the superconductive ceramic because of the fact that most of the superconductive ceramics are bases, then the wiring strip is allowed to stay in the superconductive state for a prolonged period of time.

24 Claims, 5 Drawing Sheets

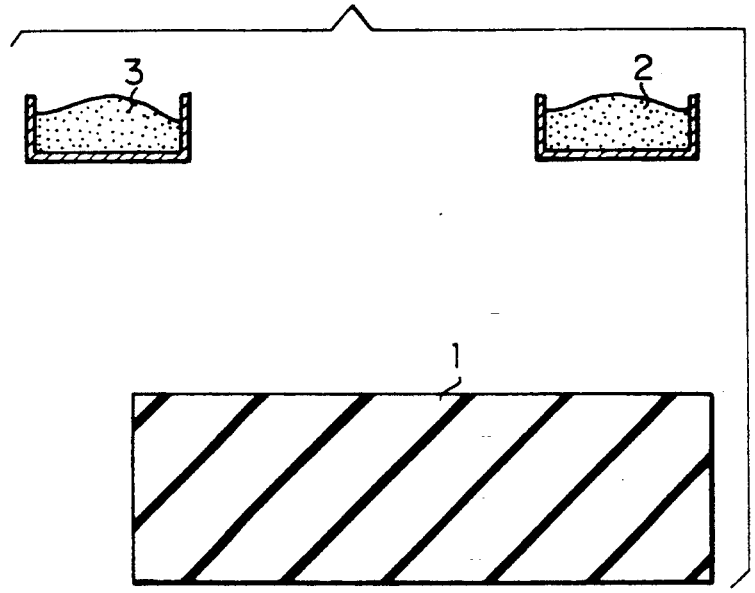
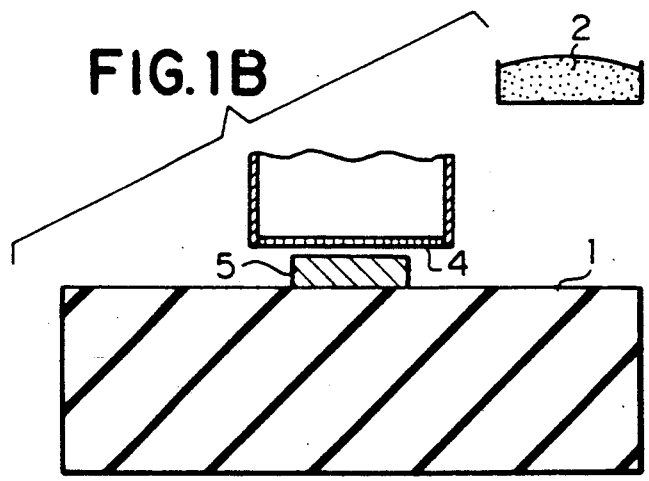

STRUCTURE OF CERAMIC SUPERCONDUCTIVE WIRING AND PROCESS OF FABRICATION THEREOF

TECHNICAL FIELD

The invention relates to a superconductive wiring structure incorporated in a thick film integrated circuit and, more particularly, to a protective film for protecting a superconductive wiring strip against influences of the environment so as to cause the superconductive wiring strip to stay in the superconducting state.

BACKGROUND ART

A typical example of the superconductive wiring is reported by Yamanaka et al, in the paper entitled as "Techniques for Formation of Superconductive Wiring on Alumina Substrate", Electronic Parts and Materials, Aug. 1987, Vol. 26, No. 8, pages 89 to 92. According to the paper, the wiring strips are formed by sintering paste lines which are printed on an usual alumina substrate and a fine grained alumina substrate, respectively, and the paste is prepared by mixing a powder of an yttrium-barium-copper oxide into an organic vehicle. The wiring strips are directly printed on the usual alumina substrate and the fine grained alumina substrate, and no protective film is provided on the wiring strips. The usual alumina substrate is lower in purity than the fine grained alumina substrate, so that it is considered that a substantial amount of impurity atoms are contained in the usual alumina substrate.

However, a problem is encountered in the prior-art superconductive wirings in stability. Namely, the wiring strips tend to lose the superconductivity within relatively short time periods, and, for this reason, the propagation paths for electric currents are liable to be blocked in the wiring strips.

Moreover, as reported in the paper, the superconductivity is achieved for the wiring strips formed on the fine grained alumina substrate, but no superconductivity is observed for the wiring strips formed on the usual alumina substrate. Then, another problem is encountered in the wiring strips reported by Yamanaka et al in the substrate used.

It is therefore an important object of the present invention to provide the structure of a superconductive wiring which is fit for use for a prolonged period of time.

It is also an important object of the present invention to provide the structure of a superconductive wiring which allows the wiring strip to stay in the superconductivity regardless of the substrate used.

DISCLOSURE OF INVENTION

It is considered that reactants such as water vapor and carbon dioxides in the atmosphere react with the superconductive ceramic to form a product which causes the wiring strip to lose the superconductivity. One of the reasons why no superconductivity is achieved for the strips on the usual alumina substrate is also supposed to be the difference in purity between the usual alumina substrate and the fine grained alumina substrate. Namely, the usual alumina contains a relatively large amount of silicon dioxide which prohibits the yttrium-barium-copper oxide from the superconductivity through a reaction therebetween.

To accomplish these objects, the present invention proposes to wrap the superconductive strip in a protective film the material of which does not react with the superconductive oxide used for formation of the wiring strip.

In accordance with one aspect of the present invention, there is provided a structure of superconductive wiring fabricated on an insulating substrate, comprising: a) a conductive pattern having at least one wiring strip of a superconductive ceramic formed on the insulating substrate, the superconductive ceramic being of the base; and b) a protective film covering the conductive pattern and formed of a bismuth oxide, the superconductive ceramic material is formed of an oxygen compound containing at least one element selected from the group consisting of scandium, yttrium and lathanides, at least one alkaline earth metal and copper. The basic oxide and the superconductive ceramic may be formed of a bismuth oxide and an oxygen compound containing at least one element selected from the group consisting of scandium, yttrium and lathanides, at least one alkaline earth metal and copper. In one implementation, the oxygen compound may contain a plurality of elements selected from the group consisting of scandium, yttrium and lathanides, a plurality of alkaline earth metals and copper. If the superconductive ceramic is selected to be largely equal in thermal expansion coefficient to the basic oxide, the protective film is free from undesirable cracks and separation from the conductive pattern, thereby allowing the conductive pattern to stay in the superconductive state for a prolonged period of time. In another implementation, a pad layer of a basic oxide intervenes between the insulating substrate and the conductive pattern for protecting the conductive pattern against the impurities contained in the substrate.

In accordance with another aspect of the present invention there is provided a process of fabricating a superconductive wiring structure, comprising the steps of: a) preparing an insulating layer, a first paste containing a bismuth oxide, and a second paste including a first powder of an oxygen compound containing at least one element selected from the group consisting of scandium, yttrium and lathanides, at least one alkaline earth metal and copper; b) forming a paste pattern having at least one paste film of the second paste on the insulating layer; c) covering the paste pattern with the first paste; and d) placing the insulating layer in a high temperature ambient for simultaneously sintering the paste pattern and the first paste to form a conductive pattern and a protective film. If the insulating layer is formed on an insulating substrate, the insulating layer may be printed thereon by using a paste containing a basic oxide.

BRIEF DESCRIPTION OF DRAWINGS

The features and advantages of a superconductive wiring structure and a process of fabrication thereof according to the present invention will be more clearly understood from the following description taken in conjunction with the accompanying drawings in which:

FIGS. 1A to 1D are cross sectional views showing a process sequence for fabricating the structure of a superconductive wiring according to the present invention;

BEST MODE FOR CARRYING OUT THE INVENTION

First Embodiment

Figure 1C:
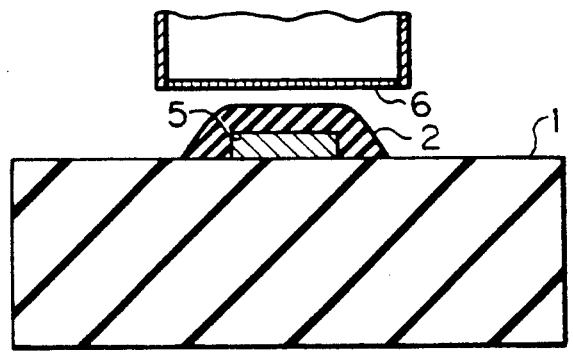

Referring first to FIGS. 1A to 1D of the drawings, description is made for a process sequence for fabricating the structure of a superconductive conductive pattern embodying the present invention. Although only one wiring strip is shown in FIGS. 1A to 1D, a plurality of wiring strips are formed on, for example, an yttrium stabilized zirconia substrate 1 for implementing a thick film integrated circuit.

The process starts with preparation of the yttrium stabilized zirconia substrate 1 ( which is sometimes abbreviated as "YSZ"), a first paste 2 containing a bismuth oxide represented by the molecular formula of $Bi_2O_3$ and a second paste 3 including first and second powders both mixed into an organic vehicle as shown in FIG. 1A. The first powder is formed from an oxygen compound containing an element selected from the group consisting of scandium, yttrium and lathanides, an alkaline earth metal and copper, and the second powder contains an alkaline earth metal carbonate. In this instance, the organic vehicle is provided by mixing an ethyl cellulose and a buthl carbinol acetate, and the alkaline earth metal used for the second powder is identical with the alkaline earth metal used for the oxygen compound. If the oxygen compound is formed of an yttrium-barium-copper oxide, the thermal expansion coefficient is fallen into the range between about $13 \times 10^{-6}$ per degree in centigrade and about $14 \times 10^{-6}$ per degree in centigrade, so that the thermal expansion coefficient is largely equal to that of the bismuth oxide which is about $15 \times 10^{-6}$ per degree in centigrade.

First, the second paste 3 is printed on the yttrium stabilized zirconia substrate 1 through a 250 mesh screen 4 in Japanese industrial standard screen scale to form a paste film 5 which forms part of the paste pattern, and the paste film 5 is deposited to a thickness of about 10 microns. The resultant structure of this stage is illustrated in FIG. 1B.

The paste film 5 is dried in the air at about 125 degrees in centigrade for about 10 minutes, and, thereafter, the first paste 2 is printed through a 250 mesh screen 6 in Japanese industrial standard screen scale so as to perfectly cover the paste pattern as illustrated in FIG. 1C. In order to perfectly cover the paste pattern, the first paste 2 is deposited to a thickness of about 10 microns and has an area sufficiently larger than that of the paste pattern. After the screen printing, the first paste 2 is dried in the air at about 125 degrees in centigrade for about 10 minutes, then the substrate 1 is placed in a high temperature ambient for sintering step. Namely, the substrate 1 is placed in a furnace chamber not shown ) and, then, the air in the furnace chamber is heated up to about 900 degrees in centigrade to create the high temperature ambient. The substrate with the paste pattern covered with the first paste 2 is kept in the high temperature ambient for about 2 hours, so that the paste pattern and the first paste are simultaneously sintered to form a conductive pattern with a wiring strip 7 and a protective film 8 covering the conductive pattern as illustrated in FIG. 1D.

Figure 1D:
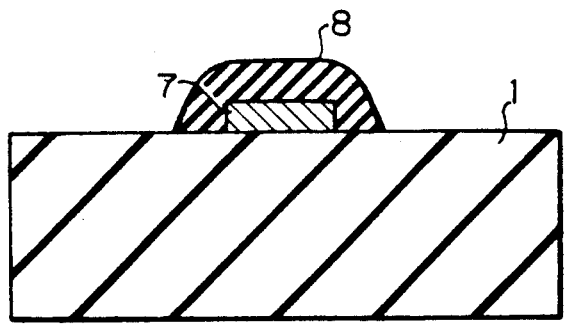

As will be seen from FIG. 1D, the wiring strip 7 of the superconductive ceramic material is covered with the protective film 8, so that the water vapor and the carbon dioxides can not directly contact with the wiring strip 7. Moreover, the superconductive ceramic material is of the base, and the protective film 8 is formed of a bismuth oxide which is of the basic oxide. Then, no substantial chemical reaction takes place between the wiring strip 7 and the protective film 8, thereby allowing the wiring strip 7 to stay in the superconductive state for a prolonged period of time. In addition, the bismuth oxide is largely equal in thermal expansion coefficient to the superconductive ceramic material. This results in that cracks and separations are hardly produced in the protective film 8 even if the wiring strip 7 is cooled to an operating temperature, thereby adding to the durability and accordingly the service life of the thick film integrated circuit as a whole.

Moreover, the first powder may be formed of an oxide represented by the molecular formula of $(Gd_{0.5}Ho_{0.5})_{1.0}(Ba_{0.9}Sr_{0.1})_{2.0}Cu_{3.0}O_{6.9}$ or, alternatively, an oxide represented by the molecular formula of $(Er_{0.6}Sm_{0.4})_{1.0}(Ba_{0.95}Ca_{0.05})_{2.0}Cu_{3.0}O_{6.9}$.

Second Embodiment

Turning to FIGS. 2A to 2D, another process sequence is described for formation of the structure of a superconductive wiring embodying the present invention. In this process sequence, description is focused upon a single wiring strip forming part of a conductive pattern incorporated in a thick film integrated circuit.

Figure 2A:
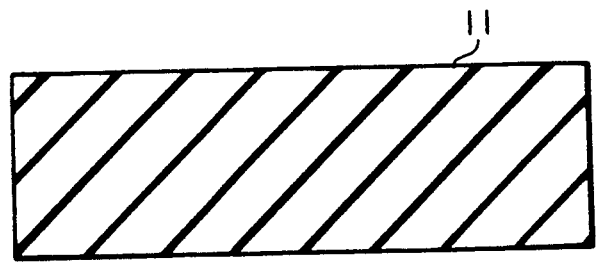
FIGS. 2A to 2D are cross sectional views showing a process sequence for fabricating another structure of superconductive wiring according to the present invention.
Figure 2B:
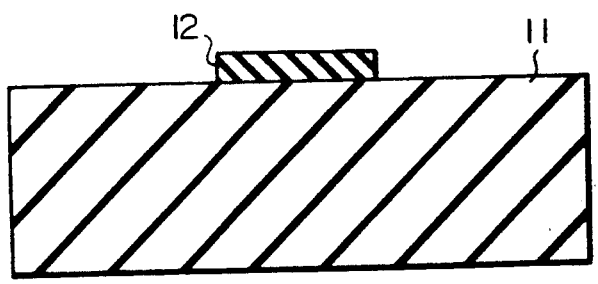

On an yttrium stabilized zirconia substrate 11 shown in FIG. 2A is printed a paste containing a bismuth oxide through a 250 mesh screen in Japanese industrial standard screen scale to form a paste film. In this instance, the paste film is deposited to a thickness of about 10 microns. After an appropriate drying stage, the substrate 11 is placed in a high temperature ambient at about 900 degrees in centigrade for sintering step. Then, a pad layer 12 of the basic oxide is formed on the substrate 11, and the resultant structure is illustrated in FIG. 2B.

Figure 2C:
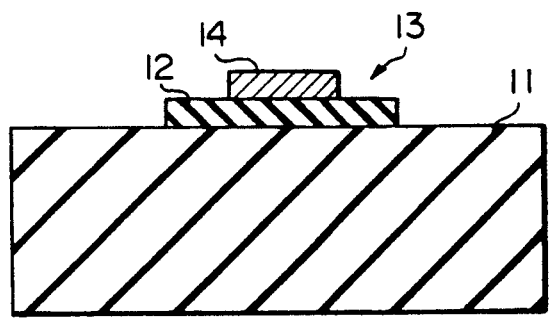

The subsequent step is formation of a paste pattern 13 which has a paste film 14. On the pad layer 12 is placed a 250 mesh screen in Japanese industrial standard screen scale where a paste is provided for screen printing. The paste is prepared by mixing a first powder of oxygen compound containing an element selected from the group consisting of scandium, yttrium and lathanides, an alkaline earth metal and copper and a second powder of an alkaline earth metal carbonate into an organic vehicle containing an ethyl cellulose and a buthl carbinol acetate. The paste on the mesh screen is squeegeed to form the paste pattern 13 on the pad layer 12 as illustrated in FIG. 2C. In this instance, the paste pattern 13 has a thickness of about 10 microns and is smaller in area than the pad layer 12. After formation of the paste pattern 13, the paste of the bismuth oxide is printed by using a 250 mesh screen in Japanese industrial standard screen scale so as to cover the paste pattern 13. The paste of the bismuth oxide is deposited to a thickness of about 10 microns and has an area enough to perfectly cover the paste pattern 13. Then, the paste pattern 13 is wrapped into the bismuth oxide and separated from not only the atmospheric environment but also the substrate 11.

Figure 2D:
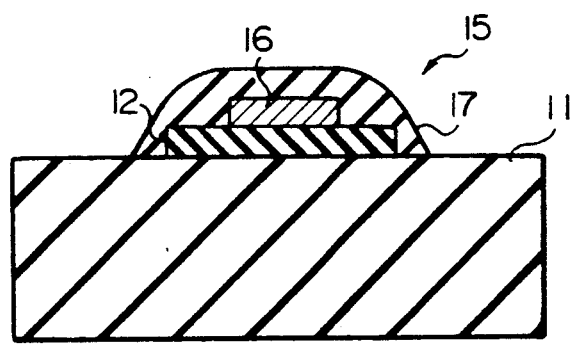

The paste of the bismuth oxide is dried in the air at about 125 degrees in centigrade for about 10 minutes and, thereafter, sintered in a high temperature ambient. The high temperature ambient is created in a furnace chamber at about 900 degrees in centigrade and the sintering step is carried out for about 2 hours. Then, the paste pattern 13 and the paste of the bismuth oxide are simultaneously sintered to form a conductive pattern 15 with a wiring strip 16 and a protective film 16 covering the conductive pattern 15. The resultant structure is illustrated in FIG. 2D.

In the process sequence described hereinbefore, the screen printing techniques are applied to form the pad layer 12, the conductive pattern 15 and the protective film 17. However, another film formation technique, such as, for example, a sputtering technique is available for forming one of them.

By virtue of the protective film 17, the conductive pattern is separated from the water vapor and the carbon dioxides in the atmosphere, so that no deterioration takes place in the conductive pattern 15, thereby allowing the conductive pattern 15 to be fit for use for a prolonged period of time. Moreover, the conductive pattern 15 is also separated from the substrate 11 by the pad layer 12. This results in that the impurities such as silicon dioxide hardly affect the conductive pattern 15. Then, an alumina substrate is available instead of the yttrium stabilized substrate 11, and, for this reason, the production cost is decreased.

Figure 3:
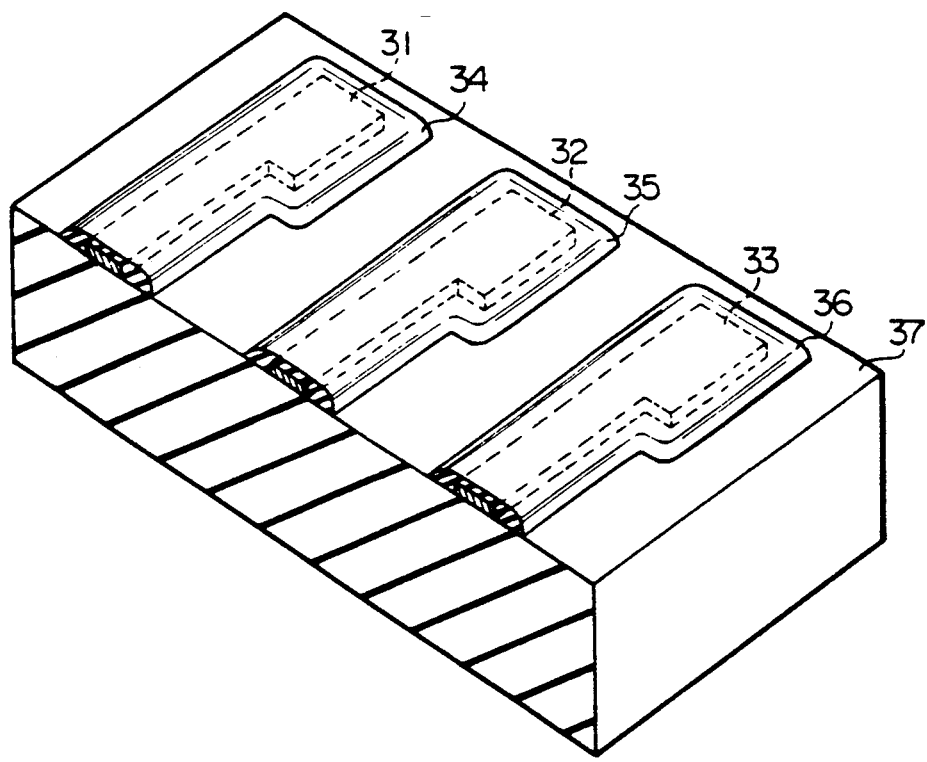
FIG. 3 is a perspective view showing a conductive pattern having a plurality of wiring strips formed on a substrate.

In the description hereinbefore made, only one wiring strip is illustrated in the figures, but the conductive pattern is allowed to have a plurality of wiring strips 31, 32 and 33 respectively covered with protective films 34, 35 and 36 as shown in FIG. 3. In this implementation, each wiring strip is capable of providing a superconductive path between component elements not shown ) for fabrication of a thick film integrated circuit formed on a substrate 37. Moreover, all of the wiring strips 31, 32 and 33 may be covered with a single protection film in an modification.

Although particular embodiments of the present invention have been shown and described, it will be obvious to those skilled in the art that various changes and modifications may be made without departing from the spirit and scope of the present invention. For example, the superconductive ceramic may be formed of an oxygen compound containing a plurality of elements selected from the group consisting of scandium, yttrium and lathanides, a plurality of alkaline earth metals and copper, and the basic oxide is not limited to the bismuth oxide.

INDUSTRIAL APPLICATION

The structure of superconductive wiring is used for establishment a current path in an electric or electronic circuit and, particularly, is preferable for a signal propagation path or a power supply path incorporated in a thick film integrated circuit.

We claim:

1. A superconductive wiring structure comprising:
   a) an electrically insulating substrate;
   b) a conductive pattern having at least one wiring strip of a basic superconductive ceramic material formed on said electrically insulating substrate and having a thermal expansion coefficient ranging from about $13 \times 10^{-6}$ per degrees centigrade to about $14 \times 10^{-6}$ per degrees centigrade, said superconductive ceramic material being selected from the group consisting of yttrium-barium-copper-oxide, gadolinium-holmium-barium-strontium-copper-oxide, and erbium-samarium-barium-calcium-copper-oxide; and
   c) a protective film covering said conductive pattern and formed of a basic bismuth oxide so that said bismuth oxide is compatible with said superconductive ceramic material.

2. A structure of superconductive wiring as set forth in claim 1, in which a thermal expansion coefficient of said bismuth oxide is approximately equal to a thermal expansion coefficient of said superconductive ceramic material.

3. A structure of superconductive wiring as set forth in claim 2, in which said structure further comprises a pad layer of bismuth oxide positioned between said electrically insulating substrate and said conductive pattern.

4. A structure of superconductive wiring as set forth in claim 1, in which said superconductive ceramic material further contains another element selected from the group consisting of scandium, yttrium and lathanides, and another alkaline earth metal.

5. A process of fabricating a superconductive wiring structure comprising the steps of:
   a) preparing an electrically insulating layer;
   b) forming a paste pattern by printing at least one paste film of a second paste through a mesh screen on said electrically insulating layer, said second paste including
      a first powder of an oxide compound selected from the group consisting of yttrium-barium-copper-oxide, gadolinium-holmium-barium-strontium-copper-oxide, and erbium-samarium-barium-calcium-copper-oxide;
   c) covering said paste pattern with a first paste of bismuth oxide; and
   d) placing said electrically insulating layer from step c) in a high temperature ambient of air at about 900° C. for about 2 hours for simultaneously sintering said paste pattern and said first paste to form a conductive pattern and a conductive film, wherein said conductive pattern has a thermal expansion coefficient ranging from about $13 \times 10^{-6}$ °C. to about $14 \times 10^{-6}$ per °C.

6. A process of fabricating a superconductive wiring structure ass et forth in claim 5, in which said second paste further contains a second powder of an alkaline earth metal carbonate.

7. A process of fabricating a superconductive wiring structure as set forth in claim 6, in which said alkaline earth metal of said oxygen compound is identical with an alkaline earth metal used for formation of said alkaline earth metal carbonate.

8. A process of fabricating a superconductive wiring structure as set forth in claim 7, in which said second paste further includes an organic vehicle and in which said first and second powders are mixed into said organic vehicle.

9. A process of fabricating a superconductive wiring structure as set forth in claim 8, in which said organic vehicle contains an ethyl cellulose and a butyl carbinol acetate.

10. A process of fabricating a superconductive wiring structure as set forth in claim 5, in which said paste pattern is deposited to a thickness of about 10 microns.

11. A process of fabricating a superconductive wiring structure as set forth in claim 10, in which said paste pattern is dried in air at about 125° C. for about 10 minutes.

12. A process of fabricating a superconductive wiring structure as set forth in claim 11, in which said paste pattern is covered with said first paste by using a screen printing technique.

13. A process of fabricating a superconductive wiring structure as set forth in claim 3, in which said first paste is deposited to a thickness of about 10 microns.

14. A process of fabricating a superconductive wiring structure as set forth in claim 13, in which said first pate is dried at about 125° C. for about 10 minutes.

15. A process of fabricating a superconductive wiring structure as set forth in claim 14, in which said electrically insulating layer serves as a substrate.

16. A process of fabricating a superconductive wiring structure as set forth in claim 5, in which said electrically insulating layer is printed on an electrically insulating substrate.

17. A process of fabricating a superconductive wiring structure as set forth in claim 16, in which said electrically insulating layer is formed of a bismuth oxide.

18. A process of fabricating a superconductive wiring structure as set forth in claim 17, in which said electrically insulating layer has a thickness of about 10 microns.

19. A structure of superconducting wiring fabricated on an electrically insulating substrate comprising:
   a) a pad layer of a bismuth oxide formed on said electrically insulating substrate;
   b) a conductive pattern having at least one wiring strip of a superconductive ceramic material, where said superconducting ceramic material
      (i) is formed of an oxide compound selected from the group consisting of yttrium-barium-copper-oxide, gadolinium-holmium-barium-strontium-copper-oxide, and erbium-samarium-barium-calcium-copper-oxide, and
      (ii) has a thermal expansion coefficient ranging from about $13 \times 10^{-6}$ per °C. to about $14 \times 10^{-6}$ per °C.; and
   c) a protective film formed of a bismuth oxide covering said conductive pattern.

20. A process fabricating a superconductive wiring structure comprising the steps of:
   a) preparing an electrically insulating layer that is yttrium stabilized;
   b) forming a paste pattern by sputtering at least one paste film of a second paste through a mesh screen to form a film about 10 μm thick on said electrically insulating layer, said second paste including a first powder of an oxide compound selected from the group consisting of yttrium-barium-copper-oxide, gadolinium-holmium-barium-strontium-copper-oxide, and erbium-samarium-barium-calcium-copper oxide;
   c) sputtering a first paste of a bismuth oxide on said paste pattern; and
   d) placing said electrically insulating layer from step c) in a high temperature ambient of air at about 900° C. for about 2 hours for simultaneously sintering said paste pattern and said first paste to form a conductive pattern and a protective film, wherein said conductive pattern has a thermal expansion coefficient ranging from about $13 \times 10^{-6}$ per °C. to about $14 \times 10^{-6}$ per °C.

21. A structure of superconducting wiring as claimed in claim 1 wherein said superconducting ceramic material may be formed of an oxide represented by the molecular formulae I or II below:

$$(GD_{0.5}Ho_{0.5})_{1.0}(Ba_{0.9}Sr_{0.1})_{2.0}Cu_{3.0}O_{6.9} \quad (I)$$

$$(Er_{0.6}Sm_{0.4})_{1.0}(Ba_{0.95}Ca_{0.05})_{2.0}Cu_{3.0}O_{6.9} \quad (II)$$

22. A process of fabricating a superconducting wiring structure as claimed in claim 5 wherein said first powder may be formed of an oxide represented by the molecular formulae I or II below:

$$(Gd_{0.5}Ho_{0.5})_{1.0}(Ba_{0.9}Sr_{0.1})_{2.0}Cu_{3.0}O_{6.9} \quad (I)$$

$$(Er_{0.6}Sm_{0.4})_{1.0}(Ba_{0.95}Ca_{0.05})_{2.0}Cu_{3.0}O_{6.9} \quad (II)$$

23. A structure of superconducting wiring as claimed in claim 19 wherein said superconducting ceramic material may be formed of an oxide represented by the molecular formulae I or II below:

$$(Gd_{0.5}Ho_{0.5})_{1.0}(Ba_{0.9}Sr_{0.1})_{2.0}Cu_{3.0}O_{6.9} \quad (I)$$

$$(Er_{0.6}Sm_{0.4})_{1.0}(Ba_{0.95}Ca_{0.05})_{2.0}Cu_{3.0}O_{6.9} \quad (II)$$

24. A process of fabricating a superconductive wiring structure as claimed in claim 20 wherein said first powder may be formed of an oxide represented by the molecular formulae I or II below:

$$(Gd_{0.5}Ho_{0.5})_{1.0}(Ba_{0.9}Sr_{0.1})_{2.0}Cu_{3.0}O_{6.9} \quad (I)$$

$$(Er_{0.6}Sm_{0.4})_{1.0}(Ba_{0.95}Ca_{0.05})_{2.0}Cu_{3.0}O_{6.9} \quad (II)$$

* * * * *

UNITED STATES PATENT AND TRADEMARK OFFICE
CERTIFICATE OF CORRECTION

PATENT NO. : 5,124,311
DATED : June 23, 1992
INVENTOR(S) : Satoru Mori

It is certified that error appears in the above-indentified patent and that said Letters Patent is hereby corrected as shown below:

Column 6, line 46, delete "ass et" and insert --as set--;

Column 7, line 9, delete "pate" and insert --paste--;

Column 8, line 21, delete "GD" and insert --Gd--.

Signed and Sealed this

Fourteenth Day of September, 1993

Attest:

BRUCE LEHMAN

*Attesting Officer*      *Commissioner of Patents and Trademarks*